United States Patent [19]

Martin

[11] Patent Number: 4,568,411
[45] Date of Patent: Feb. 4, 1986

[54] METAL/SEMICONDUCTOR DEPOSITION

[75] Inventor: Brian Martin, Ipswich, England

[73] Assignee: British Telecommunications plc, London, United Kingdom

[21] Appl. No.: 672,233

[22] Filed: Nov. 16, 1984

[30] Foreign Application Priority Data

Nov. 22, 1983 [GB] United Kingdom ............... 8331158

[51] Int. Cl.[4] .................. B44C 1/22; C03C 15/00; C03C 25/06; B29C 17/08
[52] U.S. Cl. .................... 156/655; 156/668; 204/192 C; 427/88; 430/312; 430/314; 430/315
[58] Field of Search .............. 427/88, 91; 430/312, 430/314, 315, 317, 318; 204/192 C, 192 EC; 156/655, 668, 656, 661.1, 904

[56] References Cited

FOREIGN PATENT DOCUMENTS

| 0031463A3 | 7/1981 | European Pat. Off. |
| 2023857 | 1/1980 | United Kingdom ............... 156/656 |
| 2059679A | 4/1981 | United Kingdom . |

OTHER PUBLICATIONS

"The Size Effect of Lift-Off Metallization of Sputtered Aluminum Films", *IEEE Transactions on Electron Devices*, vol. Ed-29, (1982), May, No. 5, New York, USA.

Primary Examiner—William A. Powell
Attorney, Agent, or Firm—Cushman, Darby & Cushman

[57] ABSTRACT

Metal is deposited by bias sputtering over a two-layer photoresist mask, the lower layer having a thickness at least 1.5 times the metal thickness and the second layer having an edge overhang in excess of 0.1 $\mu$m, and unwanted metal removed by lift-off.

5 Claims, 1 Drawing Figure

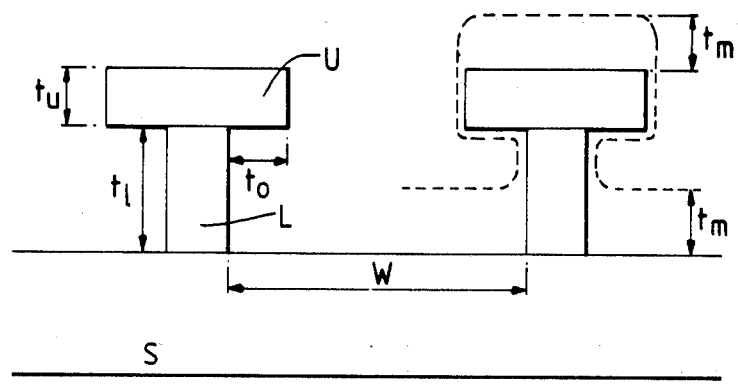

METAL/SEMICONDUCTOR DEPOSITION

BACKGROUND OF THE INVENTION

The present invention is concerned with the forming of metal patterns for microelectronics applications, and more especially with "lift-off" processes.

In such processes, metal is deposited over a photoresist image which is subsequently dissolved away by immersion in a suitable solvent thereby lifting-off unwanted metal. Because the line width of the metal is determined by photolithography, lift-off patterning offers superior control of fine line widths to that obtainable by metal etch processes. Lift-off techniques using both single and bi-level photoresist layers for metal deposited both by conventional sputtering and by evaporation have been reported—see, for example, Tom Batchelder, "A Simple Metal Lift-Off Process", Solid State Technology, February 1982 pp 111-114, and J. M. Frary and P. Seese "Lift-Off Techniques for Fine Line Metal Patterning", Semiconductor International, December 1981, pp 72-88.

"Step coverage" is an important factor in such patterning techniques. In general, in the fabrication of integrated circuits, it will be necessary to deposit metal patterns on a substrate having topographical features such as steps, ridges and so forth due to the prior formation of integrated circuit structures. Step coverage refers to the ability of the fabrication process to provide satisfactory continuity of metal over such topographical features, and it is well known that the deposition processes referred to above result in a lower metal thickness on the side walls of such features. The requirements of satisfactory step coverage and satisfactory lift-off are conflicting since the lift-off mask should defeat metal step coverage in the mask openings, so that there is a weakness or discontinuity between the metal deposited directly on the substrate through the mask openings, and that which is to be lifted off the masked areas when the photoresist mask is dissolved.

Bias sputtering (in which an electrostatic potential is applied to the substrate during the sputtering process) provides an improvement in step coverage and has been successfully used with metal etch processes but has hitherto proved unsuitable for use in lift-off techniques for the reasons indicated above.

SUMMARY OF THE INVENTION

According to the present invention, there is provided a metal patterning process comprising the steps of forming a mask on the substrate, the mask having a first layer and a second layer overlying the first and the edges of the second layer extending beyond the edges of the first layer, depositing metal over the mask and substrate, and removing the mask to remove the metal overlying the mask leaving a metal pattern over the unmasked areas of substrate; in which (a) the metal is deposited by bias sputtering
(b) the thickness of the first layer exceeds the deposited metal thickness by a factor of at least 1.5
(c) the edges of the second layer extend beyond the edges of the first layer by a distance of greater than 0.1 $\mu$m.

Preferably the thickness of the first layer exceeds the deposited metal thickness by a factor of about 2; eg in the range 1.7 or 1.8 to 2.2 or 2.3. The edge overhang is preferably around 0.5 $\mu$m; eg 0.3 or 0.4 to 0.6 or 0.7 $\mu$m.

Since the overhang is greater than conventionally used with multi-layer resist lift-off processes, attention needs to be given to the stability of the upper layer; the overhang must be sufficient to prevent metal bridging but not so large as to break off during the sputtering step. To avoid the risk of the resist overhang collapsing, which would result in poor lift off, the width of the first layer is preferably greater than twice the distance by which the second layer overhangs the first.

The minimum inter metal feature distance is thus preferably four times the minimum preferable overhang width. Thus for example with overhangs in the range 0.3 $\mu$m to 0.7 $\mu$m the minimum range of lower resist linewidths is preferably 0.6 $\mu$m to 1.4 $\mu$m and thus the minimum distance between adjacent metal features preferably 1.2 $\mu$m to 2.8 $\mu$m.

BRIEF DESCRIPTION OF THE DRAWING

FIG. 1 shows a schematic diagram of a substrate with resists deposited on it in accordance with the preferred embodiment of the present invention.

DESCRIPTION OF THE PREFERRED EMBODIMENT

EXAMPLE

A semiconductor substrate (3" diameter silicon) was firstly coated with a 1 $\mu$m photoresist layer of polymethylmethacrylate (PMMA) using a spin technique; this was then soft baked for 30 minutes at 160° C. A second photoresist layer, also 1 $\mu$m thick, of a positive photoresist material based on Novolac resin was then spun on. Three proprietary resists of this type were tested, and the one selected for use, as being the most stable, was type HPR 204 manufactured by Hunt's. It was soft baked for 10 minutes at 95° C.

The composite resist was then exposed using a photolithographed original, and the upper layer developed using Hunt's HPR 402 puddle developer. The assembly was hard baked for 10 minutes at 120° C. and then flood exposed for 20 minutes with a UV lamp power of 22.5 mW/cm$^2$. In this step, the developed upper layer acts as a mask for the lower layer and overexposure ensures, upon development, undercutting of the lower layer to provide the desired overhang. In addition, however, the response of the upper layer during this deep ultraviolet exposure determines its final stability; clearly, the more stable, the better overhang attainable. The UV exposure serves to harden only the upper "crust" of the resist, and helps to enhance stability during subsequent baking. Thus, the overhang attainable is dependent on the material used but does not depend significantly on its thickness. After a further hard bake for 10 minutes at 120° C., the PMMA was developed in methyl isobutyl (MIBK) ketone for 75 seconds. A rinse in isopropyl alcohol (IPA) was followed by a hard bake for 20 minutes at 160° C.

The resultant photoresist structure had the configuration shown in cross-section in the drawing. The upper and lower layers U, L had thicknesses $t_u = 1$ $\mu$m
$t_l = 1$ $\mu$m
and the overhang was
$t_o = 0.5$ $\mu$m
Linewidths (W) used were 2 $\mu$m.

Metal (aluminium with 2 percent silicon and 4 percent copper) was deposited, by bias sputtering (at 130 volts in a CVC AST-601 magnetron sputterer) to a thickness $t_m$ of 0.5 μm (ie the lower resist thickness exceeds the metal thickness by a factor of 2:1); the general form of the deposited metal is shown by the dotted lines in the drawing. The resist layers and the overlying metal were then removed by a fuming nitric acid solvent.

Electron microscope examination of the final product showed satisfactory lift-off with good step coverage.

Whilst the invention has been particularly shown and described with reference to preferred embodiments thereof it will be understood by those skilled in the art that various changes in the form and details may be made therein without departing from the spirit and scope of the invention.

What is claimed is:

1. A metal patterning process comprising the steps of forming a mask on the substrate, the mask having a first layer and a second layer overlying the first and the edges of the second layer extending beyond the edges of the first layer, depositing metal over the mask and substrate, and removing the mask to remove the metal overlying the mask leaving a metal pattern over the unmasked areas of substrate; in which
   (a) the metal is deposited by bias sputtering
   (b) the thickness of the first layer exceeds the deposited metal thickness by a factor of at least 1.5
   (c) the edges of the second layer extend beyond the edges of the first layer by a distance of greater than 0.1 μm.

2. A process according to claim 1 in which the thickness of the first layer exceeds the deposited metal thickness by a factor in the range 1.7 to 2.3.

3. A process according to claim 1 in which the thickness of the first layer exceeds the deposited metal thickness by a factor in the range 1.8 to 2.2.

4. A process according to claim 1, in which the distance by which the upper layer extends beyond the first layer is in the range 0.3 to 0.7 μm.

5. A process according to claim 1 or claim 4 in which the width of said first layer is greater than twice the distance by which said second layer extends beyond said first layer.

* * * * *